(12) United States Patent
Shin

(10) Patent No.: US 10,034,395 B2
(45) Date of Patent: Jul. 24, 2018

(54) FLEXIBLE DISPLAY DEVICE

(71) Applicant: Samsung Display Co., Ltd., Yongin-si, Gyeonggi-do (KR)

(72) Inventor: Heon Jung Shin, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/958,788

(22) Filed: Dec. 3, 2015

(65) Prior Publication Data

US 2016/0270210 A1 Sep. 15, 2016

(30) Foreign Application Priority Data

Mar. 12, 2015 (KR) ........................ 10-2015-0034694

(51) Int. Cl.
*H01L 51/52* (2006.01)
*H05K 5/00* (2006.01)
*G09F 9/30* (2006.01)

(52) U.S. Cl.
CPC ........... *H05K 5/0017* (2013.01); *G09F 9/301* (2013.01); *H01L 51/5237* (2013.01)

(58) Field of Classification Search
CPC .................................................. H05K 5/0017
See application file for complete search history.

(56) References Cited

U.S. PATENT DOCUMENTS 9,048,457 B2 * 6/2015 Kinohira ............. H01L 51/5281
2014/0138635 A1 5/2014 Lee et al.

FOREIGN PATENT DOCUMENTS

| JP | 2011-197402 A | 10/2011 |
| KR | 10-2003-0042952 A | 6/2003 |
| KR | 10-0681415 B1 | 2/2007 |
| KR | 10-2008-0078632 A | 8/2008 |
| KR | 10-2009-0004942 A | 1/2009 |
| KR | 10-1167231 B1 | 7/2012 |
| KR | 10-2014-0063306 A | 5/2014 |

* cited by examiner

*Primary Examiner* — Fernando L Toledo
*Assistant Examiner* — Valerie N Newton
(74) *Attorney, Agent, or Firm* — Knobbe, Martens, Olson & Bear, LLP

(57) ABSTRACT

A flexible display device is disclosed. In one aspect, the display device includes a display substrate and a display element layer formed over the display substrate and including a matrix of pixels. The display device also includes a thin film encapsulation layer formed over the display substrate and the display element layer so as to protect the display substrate and the display element layer. The display device further includes a window layer formed over the thin film encapsulation layer and a hard coating layer formed over the window layer and having greater hardness than the window layer. The hard coating layer comprises an elastic layer including a plurality of fillers.

19 Claims, 11 Drawing Sheets

FLEXIBLE DISPLAY DEVICE

RELATED APPLICATIONS

This application claims priority to and the benefit of Korean Patent Application No. 10-2015-0034694 filed in the Korean Intellectual Property Office on Mar. 12, 2015, the entire contents of which are incorporated herein by reference.

BACKGROUND

Field

The described technology generally relates to a flexible display device.

Description of the Related Technology

A typical display device has a structure in which a cover window is bonded to the whole surface of a display panel. When manufacturing a bendable and stretchable flexible display device, the cover window is formed of a plastic film such as polyethylene terephthalate (PET), polycarbonate (PC), polyimide (PI), poly(methylmethacrylate) (PMMA), and the like. In addition, a hard coating layer is provided above the cover window to realize sufficient hardness of the window surface. However, the hard coating layer can realize the hardness but not enable sufficient stretchability.

In order to satisfy the hardness constraint, which is a desired characteristic of the window, a resin material such as an acryl-based resin or an epoxy-based resin and an organic/inorganic-based additive are mixed through functional coating to form a hard coating layer using a UV curable hard coating method. However, the hard coating method for hardness increase of the window has characteristics of glass so that stretching is impossible. Also, even though the window layer is stretched, the window cannot properly function due to delamination between the window layer and the hard coating layer. That is, a combination structure of the window layer and the hard coating layer applied to the flexible display device has a limit in realization of a structure that can increase hardness and satisfy a desired level of elongation or stretching.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a flexible display device that can have both high-hardness and stretchable characteristics by layering a hard coating layer including an elastic layer and a plurality of fillers on a window layer.

Another aspect is a flexible display device that includes: a display element layer formed on the display substrate and including a plurality of pixels; a thin film encapsulation layer covering the display substrate and the display element layer for protection; a window layer formed on the thin film encapsulation layer; and a hard coating layer hard-coated to cover the window layer for protection and having higher hardness than the window layer, wherein the hard coating layer includes an elastic layer and a plurality of fillers included in the elastic layer.

The filler can be made of a silicon-based material or a nano-silica-based material.

The elastic layer can be formed of an elastomer or a pressure sensitive adhesive (PSA).

The fillers can be formed in the shape of a quadrangular plate and can be tilted with a predetermined angle.

The fillers can be formed in the shape of a triangular plate and can be tilted with a predetermined angle.

The fillers can be arranged in a manner such that one side of each triangular-shaped plate faces upward.

The fillers can be formed in the shape of a roly poly and can be regularly arranged.

The fillers can be formed in the shape of a sphere and can be irregularly arranged.

The hard coating layer can have a thickness of 1 μm to 100 μm.

The hard coating layer can undergo coating for a hardness characteristic, an anti-glare treatment, an anti-reflection treatment, or an anti-fingerprint treatment.

The hard coating layer can have pencil hardness of 2H to 5H.

The hard coating layer can have elongation of 5% to 10%.

The window layer can be a plastic film such as a polyimide (PI) or polyethylene terephthalate (PET).

The flexible display device can further include a functional layer formed between the thin film encapsulation layer and the window layer.

The functional layer can be formed of a phase delay film.

The functional layer can be formed of a polarizer.

The display element layer can include an organic light emitting display element.

Another aspect is a flexible display device, comprising: a display substrate; a display element layer formed over the display substrate and including a matrix of pixels; a thin film encapsulation layer formed over the display substrate and the display element layer so as to protect the display substrate and the display element layer; a window layer formed over the thin film encapsulation layer; and a hard coating layer formed over the window layer and having greater hardness than the window layer, wherein the hard coating layer comprises an elastic layer including a plurality of fillers.

In the above display device, the filler is formed of a silicon-based material or a nano-silica-based material. In the above display device, the elastic layer is formed of an elastomer or a pressure sensitive adhesive (PSA). In the above display device, the fillers have the shape of a quadrangular plate and are tilted with a predetermined angle with respect to the display substrate. In the above display device, the fillers have the shape of a triangular plate and are tilted with a predetermined angle. In the above display device, one corner of each of the fillers faces upward in the depth dimension of the display device. In the above display device, the fillers have the shape of a roly poly and are regularly arranged. In the above display device, the fillers have a spherical shape and are irregularly arranged. In the above display device, the hard coating layer has a thickness in the range of about 1 μm to about 100 μm.

In the above display device, the hard coating layer is glare-resistant, reflection-resistant, or fingerprint-resistant. In the above display device, the hard coating layer has pencil hardness in the range of about 2H to about 5H. In the above display device, the hard coating layer is configured to elongate in the range of about 5% to about 10% when the display is stretched. In the above display device, the window layer includes a plastic film formed of polyimide (PI) or polyethylene terephthalate (PET). The above display device further comprises a functional layer interposed between the thin film encapsulation layer and the window layer. In the above display device, the functional layer includes a phase delay film. In the above display device, the functional layer is formed of a polarizer. In the above display device, the display element layer comprises an organic light-emitting diode (OLED).

Another aspect is a flexible display device, comprising: a display substrate; a window layer formed over the display substrate; and a hard coating layer formed over the window layer and having greater hardness than the window layer, wherein the hard coating layer comprises a plurality of elastic fillers, and wherein the fillers are configured to tilt when the display device is stretched.

In the above display device, the fillers are arranged in a matrix and have a quadrangular shape, and wherein the angle of the fillers with respect to the display substrate, when the display substrate is stretched, is greater than the angle when the display substrate is not stretched. In the above display device, the fillers are arranged in two rows including an upper row and a lower row located below the upper row, wherein the fillers in the upper row are larger than the fillers in the lower row, and wherein, when the display device is stretched, at least part of a selected filler in the upper row is configured to move into a gap between the respective filler in the lower row and a neighboring filler thereof.

According to at least one of the disclosed embodiments, hardness and elongation required for a flexible display device can be simultaneously satisfied.

In addition, a hard coating layer having an excellent elastic restoring force is formed on the window layer so that stress unevenly generated in the window layer can be evenly dispersed, thereby minimizing distortion of an image viewed in a front portion of the window layer after stretching.

In addition, high-hardness fillers are included in an elastic layer of the hard coating layer so that hardness of the hard coating layer can be increased after stretching, and resistance to pressure or puncture is improved.

DETAILED DESCRIPTION OF CERTAIN INVENTIVE EMBODIMENTS

Figure 1:
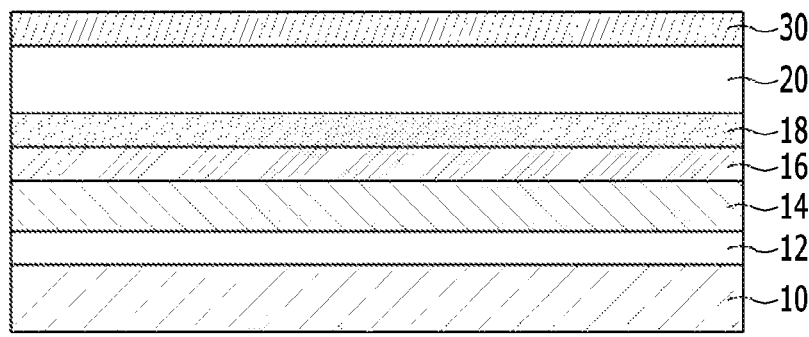
FIG. 1 is a cross-sectional view of a flexible display device according to an exemplary embodiment.

Hereinafter, an exemplary embodiment will be described in detail with reference to the accompanying drawings so that those skilled in the technical field to which the described technology pertains can carry out the exemplary embodiments. As those skilled in the art would realize, the described embodiments can be modified in various different ways, all without departing from the spirit or scope of the described technology.

Further, in exemplary embodiments, since like reference numerals designate like elements having the same configuration, a first exemplary embodiment is representatively described, and in other exemplary embodiments, only a configuration different from the first exemplary embodiment will be described.

It shall be noted that the drawings are schematic and do not depict exact dimensions. The relative proportions and ratios of elements in the drawings can be exaggerated or diminished in size for the sake of clarity and convenience in the drawings, and such arbitrary proportions are only illustrative and are not limiting in any way. Like reference numerals are used for like structures, elements, or parts shown in two or more drawings to show similar characteristics. When one part is said to be "over" or "on" another part, the one part can be directly over the other part or can be accompanied by another part interposed therebetween.

Exemplary embodiments specifically show preferred exemplary embodiments. As a result, various modifications of the drawings are anticipated. Therefore, the exemplary embodiments are not limited to a specific form of an illustrated region, and for example, include modifications of a manufactured form. In this disclosure, the term "substantially" includes the meanings of completely, almost completely or to any significant degree under some applications and in accordance with those skilled in the art. The term "connected" can include an electrical connection.

Hereinafter, a flexible display device according to an exemplary embodiment will be described with reference to FIG. 1 to FIG. 3B.

FIG. 1 is a schematic cross-sectional view of a flexible display device 100 according to an exemplary embodiment. Referring to FIG. 1, the flexible display device 100 includes a display substrate 10, a display element layer 12 formed on the display substrate 10 and including a plurality of pixels, and a thin film encapsulation layer 14 covering the display substrate 10 and the display element layer 12 for protection. The flexible display device 100 also includes a window layer 20 formed on the thin film encapsulation layer 14, and a hard coating layer 30 hard-coated to protect the window layer 20 by covering the same and of which strength is greater than the strength of the window layer 20.

The display substrate 10 can be a liquid crystal display panel including liquid crystals or an organic light-emitting diode (OLED) display panel including an organic light emitting portion. Alternatively, as a transparent substrate, the display substrate 10 can be a flexible substrate such as a polymer film.

The display element layer 12 is formed on the display substrate 10, and includes an element area where an active element such as a thin film transistor is formed and a light emission area where a light emission layer is formed. The element area and the light emission area can be separated from each other or overlapping each other. The display element layer 12 can include an OLED.

The thin film encapsulation layer 14 is formed on the display element layer 12 and faces the display substrate 10. The thin film encapsulation layer 14 can prevent oxygen and moisture from flowing into the display element layer 12 for protection.

The window layer 20 can be formed on the thin film encapsulation layer 14, and can be formed of a polyimide (PI) or polyethylene terephthalate (PET). The window layer 20 can be attached to the thin film encapsulation layer 14 by an adhesive layer 18 such as a pressure sensitive adhesive (PSA).

The hard coating layer 30 covers the window layer 20 for protection. The hard coating layer 30 can be formed with a thickness of greater than about 1 μm and less than about 100 μm. The hard coating layer 30 is formed of materials having scratch resistance and friction resistance to prevent occurrence of defects such as a scratch, a crack, and the like in the window layer 20 formed of a plastic material. The hard coating layer 30 is formed to be stronger than the window layer 20. The hard coating layer 30 can be, for example, formed by coating a composition for hard coating that includes an acrylate oligomer and monomer to the upper surface of the window layer 20, drying the coated composition, and curing the composition with ultraviolet (UV) rays.

Figure 2A:
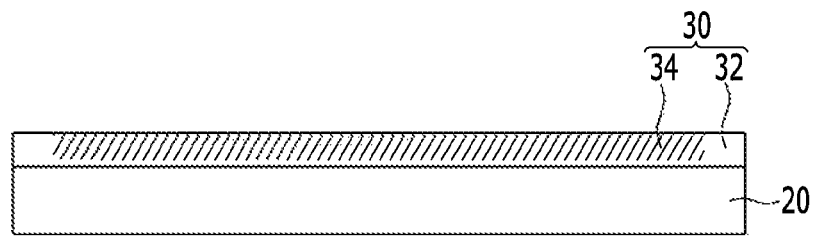
FIG. 2A is a schematic cross-sectional view of a window layer and a hard coating layer of the flexile display device according to the exemplary embodiment before stretching is performed.

FIG. 2A is a schematic cross-sectional view of the window layer and the hard coating layer before being stretched in the flexible display device according to the exemplary embodiment. In addition, FIG. 2B is a schematic cross-sectional view of the window layer and the hard coating layer after being stretched in the flexible display device according to the exemplary embodiment.

Figure 2B:
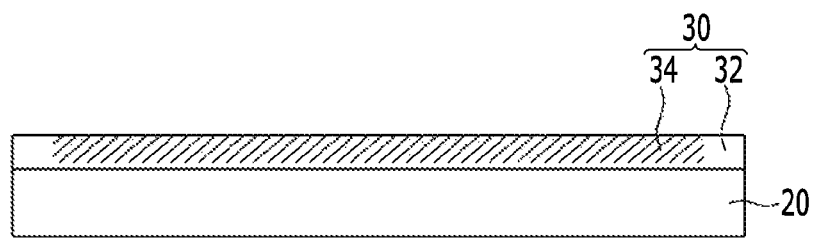
FIG. 2B is a schematic cross-sectional view of the window layer and the hard coating layer of the flexile display device according to the exemplary embodiment after stretching is performed.

Referring to FIG. 2A and FIG. 2B, the hard coating layer 30 includes an elastic layer 32 and a plurality of fillers 34 included in the elastic layer 32. The elastic layer 32 is formed of an elastomer or a pressure sensitive adhesive (PSA), and the fillers 34 can be included in the elastic layer 32. The fillers 34 can be regularly arranged in the elastic layer 32, and can be formed in the shape of a quadrangular plate tilted with a predetermined angle. Alternatively, the filler 34 can be formed of a silicon (Si)-based material or a nano-silica-based material.

Figure 3A:
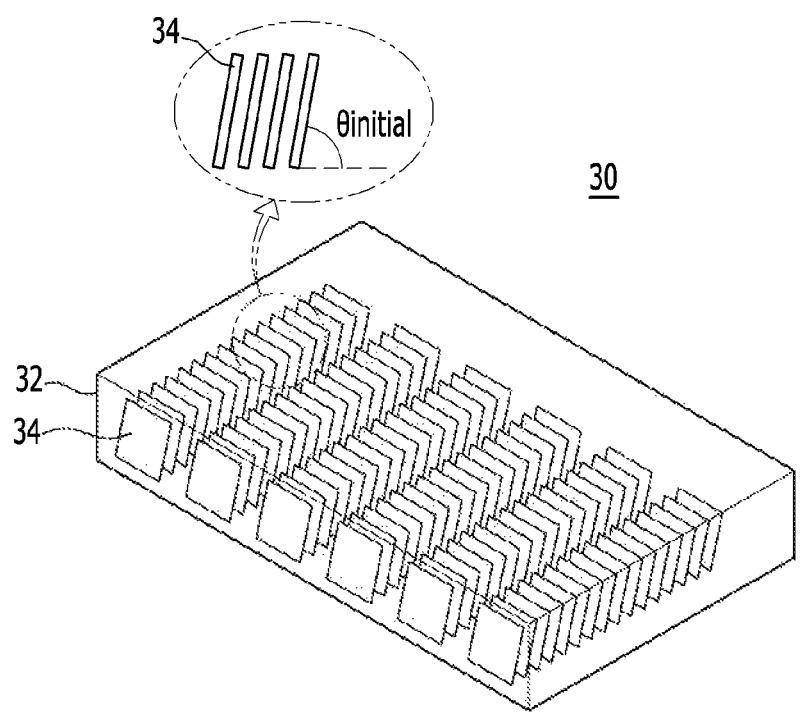
FIG. 3A is a schematic perspective view of the hard coating layer of the flexible display device according to the exemplary embodiment before stretching is performed.
Figure 3B:
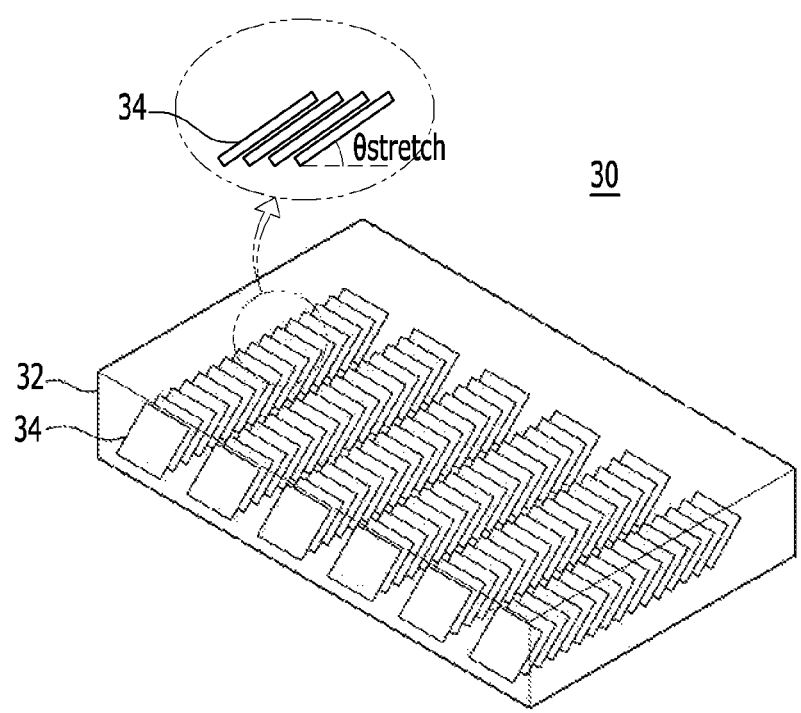
FIG. 3B is a schematic perspective view of the hard coating layer of the flexible display device according to the exemplary embodiment after stretching is performed.

FIG. 3A is a schematic perspective view of the hard coating layer of the flexible display device before being stretched according to the exemplary embodiment. FIG. 3B is a schematic perspective view of the hard coating layer of the flexible display device after being stretched according to the exemplary embodiment.

As shown in FIG. 2A and FIG. 3A, before the flexible display device 100 is stretched, the plurality of fillers 34 of the hard coating layer 30 are tilted with a first angle $\theta_{initial}$ with reference to a horizontal direction. As shown in FIG. 2B and FIG. 3B, after the flexible display device 100 is stretched, the plurality of fillers 34 of the hard coating layer 30 are tilted with a second angle $\theta_{stretch}$ with reference to the horizontal direction. The first angle $\theta_{initial}$ before stretching is greater than the second angle $\theta_{stretch}$ after stretching. In addition, the first angle $\theta_{initial}$ before stretching and the second angle $\theta_{stretch}$ after stretching are less than 90 degrees.

The hard coating layer 30 includes the window layer 20, the elastic layer 32 having excellent adhesiveness, and the plurality of fillers 34 included in the elastic layer 32. The hard plate-shaped fillers 34 are arranged to be tilted less than 90 degrees such that hardness can be improved before stretching. For example, as the thickness of the elastic layer 32 is decreased after stretching, surface density of the plate-shaped high-hardness fillers 34 increases and the alignment angle decreases. Hardness contribution of the surface of the high-hardness fillers 34 is improved so that the surface hardness is improved after stretching.

Meanwhile, the hard coating composition is coated to the upper surface of the window layer 20, the coated composition is dried, and then the dried composition is cured with UV such that a high-hardness hard coating layer 30 can be formed. In addition, an anti-glare treatment, an anti-reflection treatment, or an anti-fingerprint treatment can be performed.

The hard coating layer 30 is as hard as pencil hardness of about 2H to about 5H, and has elongation of about 5% to about 10%.

Figure 4A:
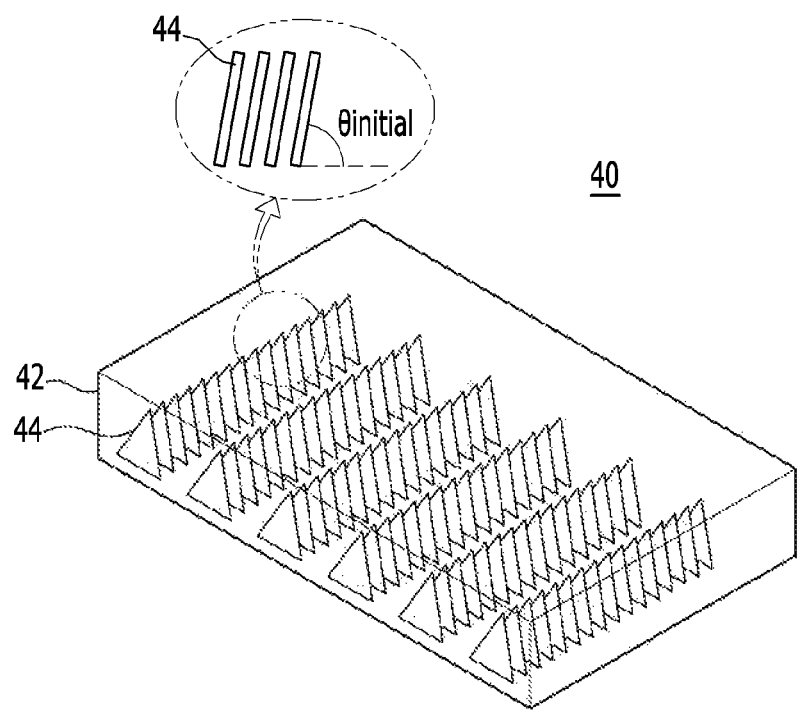
FIG. 4A is a schematic perspective view of the hard coating layer of the flexible display device according to the exemplary embodiment before stretching is performed.
Figure 4B:
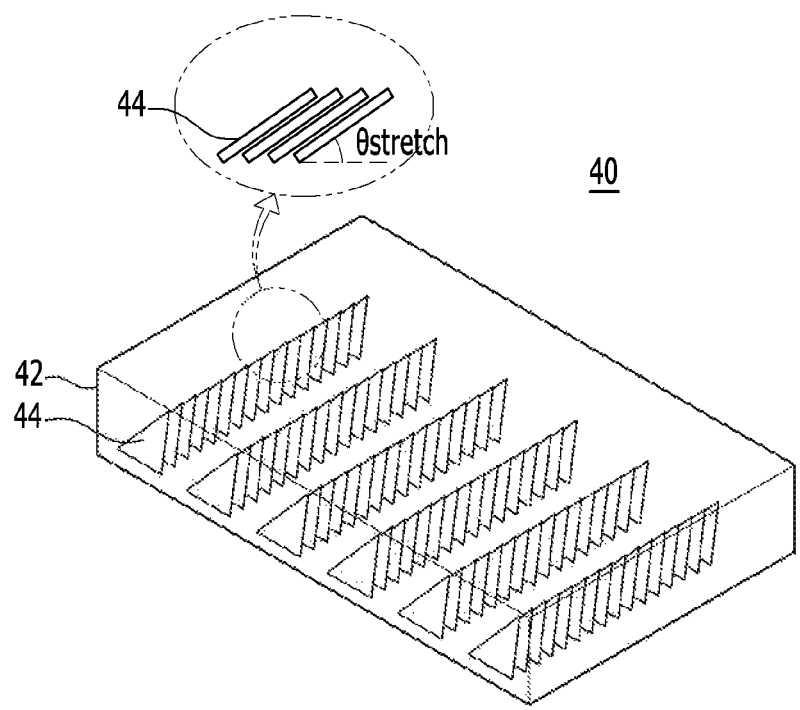
FIG. 4B is a schematic perspective view of the hard coating layer of the flexible display device according to the exemplary embodiment after stretching is performed.

FIG. 4A is a schematic perspective view of a hard coating layer before stretching of a flexible display device according to another exemplary embodiment. FIG. 4B is a flexible perspective view of a hard coating after stretching of the flexible display device according to the other exemplary embodiment.

Referring to FIG. 4A and FIG. 4B, a plurality of fillers 44 can be formed in the shape of a triangular plate and can be tilted with a predetermined angle. The fillers 44 can be arranged in a manner such that one side of the triangular-plate fillers faces upward. The fillers 44 are formed in the shape of the triangular plate, and one side of the fillers 44 faces upward such that hardness of the hard coating layer 40 is the same as the hardness of the hard coating layer including the quadrangular-shaped fillers. This can be realized with a much smaller amount of fillers compared to the quadrangular-shaped fillers. Further, since the much smaller amount of fillers 44 is used, a defect in an interface between the fillers 44 and an elastic layer 42 which can be caused after stretching can be reduced. In this case, as in FIG. 3A and FIG. 3B, a first angle $\theta_{initial}$ before stretching is greater than a second angle $\theta_{stretch}$ after stretching. In addition, the first angle $\theta_{initial}$ before stretching and the second angle $\theta_{stretch}$ after stretching are less than 90 degrees.

Figure 5A:
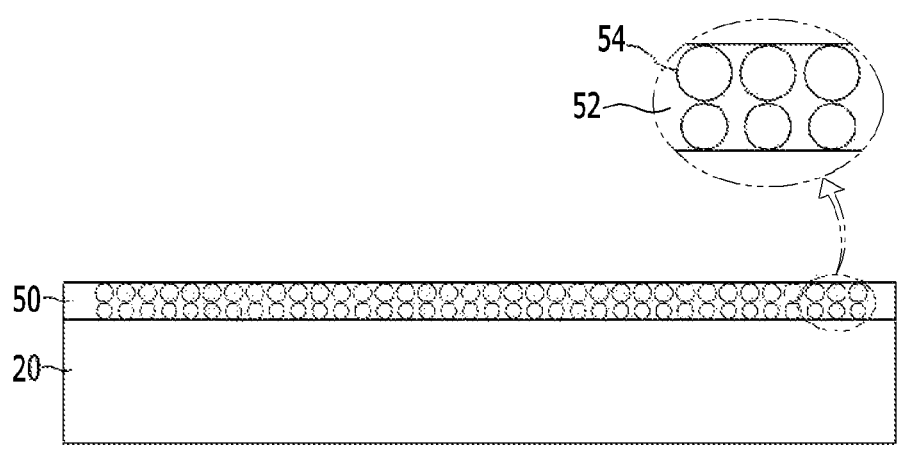
FIG. 5A is a schematic cross-sectional view of a window layer and a hard coating layer before stretching in a flexible display device according to another exemplary embodiment.
Figure 5B:
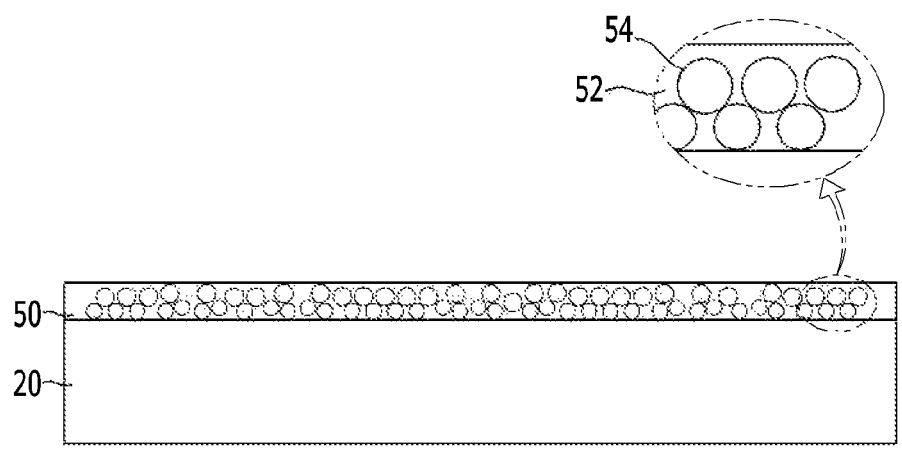
FIG. 5B is a schematic cross-sectional view of the window layer and the hard coating layer after stretching in the flexible display device according to the other exemplary embodiment.

FIG. 5A is a schematic cross-sectional view of a window layer and a hard coating layer before stretching in a flexible display device according to another exemplary embodiment. FIG. 5B is a schematic cross-sectional view of the window layer and the hard coating layer after stretching in the flexible display device according to the other exemplary embodiment.

Referring to FIG. 5A and FIG. 5B, a hard coating layer 50 includes an elastic layer 52 and a plurality of fillers 54 included in the elastic layer 52, and the plurality of fillers 54, each formed like a roly poly, are regularly arranged. Sphere-shaped fillers 54 before stretching are stacked in two rows, and upper sphere-shaped fillers 54 contact lower sphere-shaped filler 54 in diagonal (or slanted) directions after stretching such that the lower sphere-shaped fillers 54 support the sphere-shaped fillers 54 in the diagonal direction. After stretching, the upper and lower sphere-shaped fillers 54 contact each other in the diagonal direction so that hardness of the hard coating layer 50 is increased and resistance to pressure or perforation is improved.

Figure 6A:
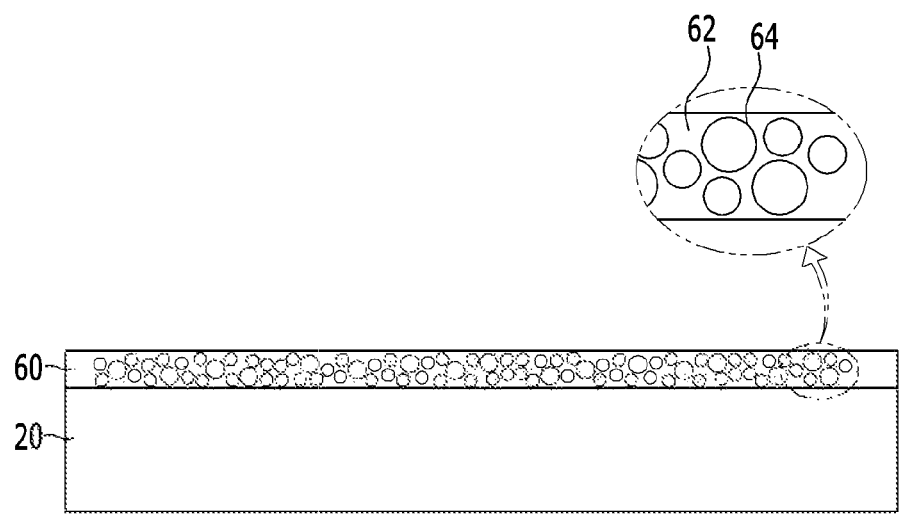
FIG. 6A is a schematic cross-sectional view of a window layer and a hard coating layer before stretching in a flexible display device according to another exemplary embodiment.
Figure 6B:
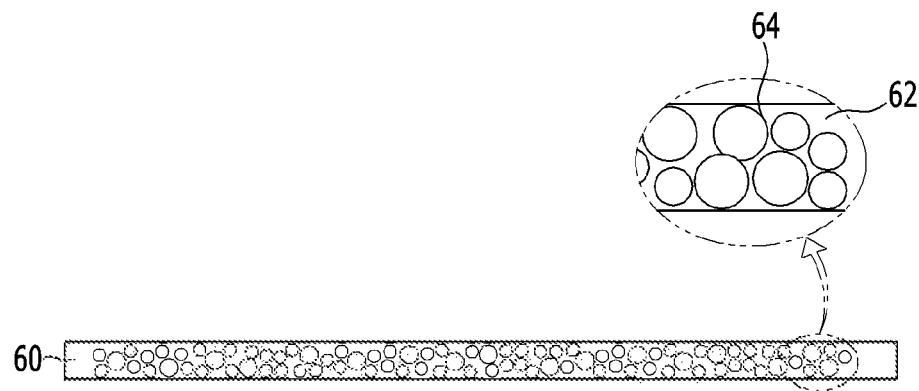
FIG. 6B is a schematic cross-sectional view of the hard coating layer after stretching in the flexible display device according to the other exemplary embodiment.

FIG. 6A is a schematic cross-sectional view of a window layer and a hard coating layer 60 before stretching in a flexible display device according to another exemplary embodiment. FIG. 6B is a schematic cross-sectional view of the hard coating layer 60 after stretching in the flexible display device according to the other exemplary embodiment.

Referring to FIG. 6A and FIG. 6B, a plurality of sphere-shaped fillers 64 are irregularly distributed in an elastic layer 62. That is, the plurality of fillers 64 are dispersed with randomized grain-sized distribution in the elastic layer 62. Due to such a structure, the fillers 64 can have a high packing ratio in the elastic layer 62, hardness of a hard coating layer 60 is increased, and resistance to pressure or perforation is improved by mutual support between the fillers 64.

Meanwhile, referring back to FIG. 1, a functional layer 16 can be further provided between the thin film encapsulation layer 14 and the window layer 20. The functional layer 16 can be formed of a phase delay film. The phase delay film can be a λ/4 phase delay film, and circularly polarizes linearly polarized light or linearly polarizes circularly polarized light. As the phase delay film, there are a birefringence film which is made by performing stretching treatment on a film made of suitable polymers such as polycarbonate or polyvinyl alcohol, polystyrene or polymethyl methacrylate, polypropylene or another polyolefin, and polyarylate or polyamide, an oriented film of a liquid crystal polymer, a film supporting an oriented layer of a liquid crystal polymer, and the like. Further, the phase delay film can be made of a Zeonor or Arton resin.

In addition, the functional layer 16 can include a polarizer. The polarizer can reduce the thickness and improve the image visibility, while securing the flexibility characteristic.

As described, required hardness and elongation of the flexible display device can both be satisfied by the flexible display device according to the exemplary embodiments.

In addition, the hard coating layer having excellent elastic restoring force is formed on the window layer so that unevenly generated stress in the window can be evenly dispersed, thereby minimizing distortion of an image viewed in a front portion of the window layer after stretching.

In addition, high-hardness fillers are included in an elastic layer of the hard coating layer so that hardness of the hard coating layer can be increased after stretching, and resistance to pressure or puncture is improved.

While inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device, comprising:
   a display substrate;
   a display element layer disposed over the display substrate and including a matrix of pixels;
   a thin film encapsulation layer disposed over the display substrate and the display element layer so as to protect the display substrate and the display element layer;
   a functional layer disposed over the thin film encapsulation layer;
   a window layer formed over the functional layer; and
   a hard coating layer formed over the window layer and having greater hardness than the window layer,
   wherein the hard coating layer comprises an elastic layer including a plurality of fillers,
   wherein the functional layer comprises a phase delay film or a polarizer, and
   wherein the hard coating layer has a bottom surface facing the window layer, and wherein each of the fillers is tilted with respect to the bottom surface of the hard coating layer.

2. The flexible display device of claim 1, wherein the fillers have the shape of a triangular plate and are tilted with a predetermined angle.

3. The flexible display device of claim 2, wherein one corner of each of the fillers faces upward in the depth dimension of the display device.

4. The flexible display device of claim 1, wherein, when the flexible display device is stretched, each of the fillers is configured to change a tilting angle from a first angle (θinitial), which is defined between each of the fillers and the bottom surface of the hard coating layer before the stretching, to a second angle (θstretch) which is defined between each of the fillers and the bottom surface of the hard coating layer after the stretching, and wherein the first angle (θinitial) is greater than the second angle (θstretch).

5. The flexible display device of claim 4, wherein the first angle (θinitial) and the second angle (θstretch) are less than 90 degrees.

6. The flexible display device of claim 1, wherein the filler is formed of a silicon-based material or a nano-silica-based material.

7. The flexible display device of claim 1, wherein the elastic layer is formed of an elastomer or a pressure sensitive adhesive (PSA).

8. The flexible display device of claim 1, wherein the fillers have the shape of a quadrangular plate and are tilted with a predetermined angle with respect to the display substrate.

9. The flexible display device of claim 1, wherein the fillers have the shape of a roly poly and are regularly arranged.

10. The flexible display device of claim 1, wherein the fillers have a spherical shape and are irregularly arranged.

11. The flexible display device of claim 1, wherein the hard coating layer has a thickness in the range of about 1 μm to about 100 μm.

12. The flexible display device of claim 1, wherein the hard coating layer is glare-resistant, reflection-resistant, or fingerprint-resistant.

13. The flexible display device of claim 1, wherein the hard coating layer has pencil hardness in the range of about 2H to about 5H.

14. The flexible display device of claim 1, wherein the hard coating layer is configured to elongate in the range of about 5% to about 10% when the display is stretched.

15. The flexible display device of claim 1, wherein the window layer includes a plastic film formed of polyimide (PI) or polyethylene terephthalate (PET).

16. The flexible display device of claim 1, wherein the display element layer comprises an organic light-emitting diode (OLED).

17. A flexible display device, comprising:
   a display substrate;
   a window layer formed over the display substrate; and
   a hard coating layer formed over the window layer and having greater hardness than the window layer, wherein the hard coating layer comprises an elastic layer including a plurality of fillers, and wherein the fillers are configured to tilt when the display device is stretched.

18. The flexible display device of claim 17, wherein the fillers are arranged in a matrix and have a quadrangular shape, and wherein the angle of the fillers with respect to the display substrate, when the display substrate is stretched, is greater than the angle when the display substrate is not stretched.

19. The flexible display device of claim 17, wherein the fillers are arranged in two rows including an upper row and a lower row located below the upper row, wherein the fillers in the upper row are larger than the fillers in the lower row, and wherein, when the display device is stretched, at least part of a selected filler in the upper row is configured to move into a gap between the respective filler in the lower row and a neighboring filler thereof.

* * * * *